Figure 1:
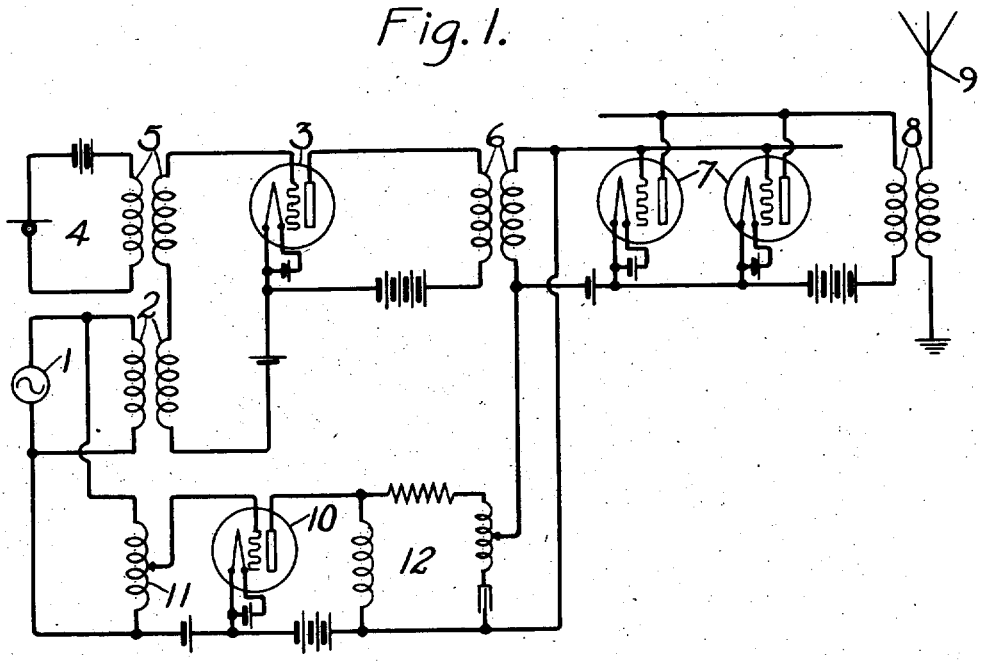

C. R. ENGLUND.

RADIOTELEPHONY.

APPLICATION FILED MAR. 3, 1920.

Reissued Apr. 19, 1921. 15,089.

Inventor:
Carl R. Englund.
by J. G. Roberts Att'y.

UNITED STATES PATENT OFFICE.

CARL R. ENGLUND, OF EAST ORANGE, NEW JERSEY, ASSIGNOR TO AMERICAN TELEPHONE AND TELEGRAPH COMPANY, A CORPORATION OF NEW YORK.

RADIOTELEPHONY.

15,089. Specification of Reissued Letters Patent. Reissued Apr. 19, 1921.

Original No. 1,258,548, dated March 5, 1918, Serial No. 83,504, filed March 11, 1916. Application for reissue filed March 3, 1920. Serial No. 362,961.

*To all whom it may concern:*

Be it known that I, CARL R. ENGLUND, a citizen of the United States, residing at East Orange, in the county of Essex and State of New Jersey, have invented certain new and useful Improvements in Radiotelephony, of which the following is a full, clear, concise, and exact description.

This invention relates to radio telephony, and in particular to a system of transmission in which only the modulated portion of a high frequency wave is radiated from the antenna.

In radio telephony it has been customary to establish in a circuit a high frequency oscillation and to modulate the amplitude of this oscillation in accordance with a signal to be transmitted. Now, it is well-known that when a high frequency carrier wave of frequency C is modulated in accordance with a signal wave of frequency S, the resultant wave radiated from the antenna is made up of three parts of frequencies C—S. C and C+S, which components may be considered to be transmitted simultaneously through the ether. It has been proposed as described in British specification No. 17,170 of 1916 of which the serial number under the new British system of consecutive numbering, is 102,503, to eliminate from the antenna the unmodulated component of frequency C, and to transmit only the modulated portions represented by the other two components. When this method is adopted the radiated wave is spoken of as a pure modulated wave. The great advantage of this method is that the waste of power represented by currents of frequency C in the antenna is eliminated, and that there is some gain in the quality of received oscillation. In order to receive signals sent in this manner it is necessary to include at the receiving station, in addition to the usual apparatus, a small generator capable of delivering currents of the eliminated frequency C, but since only a very small amount of power of this frequency is required at the receiving station, the auxiliary generator at that station need have but an extremely small power output.

In the specification above referred to, a certain method of eliminating the unmodulated component of the carrier wave is given, and this invention proposes still another way of accomplishing this purpose, namely, by superposing upon the modulated wave before it reaches the antenna an oscillation of carrier frequency which is equal in amplitude but opposite in phase to the oscillation of carrier frequency which represents the unmodulated portion of the wave to be transmitted. By this means the component to be eliminated from the antenna is neutralized in the apparatus between the primary modulating source and the antenna.

Figure 2:
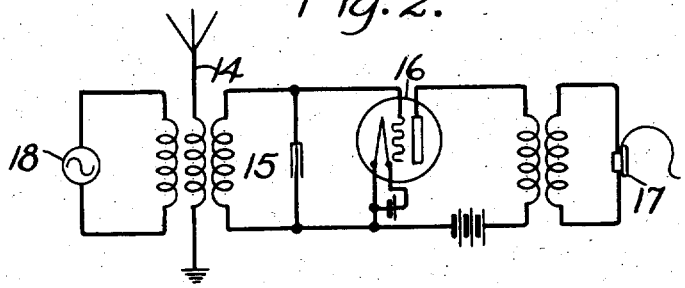

The invention will be more particularly described in connection with the drawing, in which Figure 1 represents a transmitting station constructed in accordance with this invention and Fig. 2 shows a form of receiving station by which the modulated waves may be received. This receiving station forms no part of this invention.

Referring to Fig. 1, 1 is a generator of oscillations of the frequency C and 2 a transformer by means of which these oscillations are impressed upon the input circuit of a thermionic modulator 3. 4 is a microphone circuit, the variations of current in which are impressed upon the same input circuit through the transformer 5. The result of this arrangement is, as is now well-known, to produce in the output circuit of the modulator 3 a high frequency current whose amplitude is modulated in accordance with the alternating currents set up in the microphone circuit. This output circuit is connected through transformer 6 to the common input circuit of a number of thermionic amplifiers 7 arranged in parallel, their common output circuit being coupled through transformer 8 to the radiating antenna 9.

The system so far described is characterized by the fact that currents of all three of the above mentioned frequencies occur in the antenna 9. By means of the apparatus next to be described the component of frequency C is prevented from reaching the antenna by being neutralized in the input circuit of the amplifier 7. To accomplish this, the input circuit of the amplifier 10 is connected through an autotransformer 11 to the terminals of the generator 1, the purpose of this autotransformer connection being to regulate the voltage impressed upon the input circuit of the amplifier 10. The output circuit of the latter is connected to a phase regulating device 12, which may be of any suitable form, and the voltage appearing across a section of this network is then applied to the common input circuit of amplifiers 7. It will be clear that this latter voltage will have the frequency C of oscillations produced by the generator 1, and that these may be so regulated as to intensity and phase that they shall exactly neutralize the component of frequency C appearing in the input circuit of amplifiers 7 and prevents its appearance in the output circuit of the modulator. Currents of the frequency C will therefore not appear in the antenna 9. In case the amplifier 10 or the phase regulating device 12 are not so adjusted that the neutralizing current is exactly opposite in phase or equal in intensity to the component of frequency C of the modulated current, a small portion of the said component of frequency C may not be neutralized. In such a case, the system would be operative, but less efficient, as some energy would be radiated in the form of waves of frequency C. The expressions "equal in intensity" and "opposite in phase" should, therefore, be taken to mean substantially equal in intensity and substantially opposite in phase.

Referring to Fig. 2, 14 is a receiving antenna coupled to a resonant circuit 15 tuned to the frequency C of the waves to be received. 16 is a thermionic detector whose output circuit is connected through a transformer to the translating device 17. It will be clear that the waves received by this system will lack the component of frequency C, and the function of the auxiliary generator 18 is to supply small oscillations of this frequency. The circuit of this generator may be coupled in any suitable manner to the antenna 14 or to the resonant circuit 15.

Although this invention has been described as applying to radio telephony, it will be clear to those skilled in the art that a wire telephone line may be substituted for the antenna 9 without departing from the spirit of this invention. It will further be obvious that many other circuit arrangements may be devised by means of which the oscillation of frequency C may be neutralized in the input circuit of the amplifier 7.

What is claimed is:

1. A radio transmitting system comprising in combination means for generating and modulating high frequency oscillations, means for impressing upon said modulated oscillations an unmodulated oscillation of opposite phase, and means for amplifying and transmitting the resultant of said oscillations.

2. A radio transmitting system comprising in combination means for generating and modulating high frequency oscillations, means for neutralizing the unmodulated component of said modulated wave, and means for amplifying and transmitting the modulated portion of said wave.

3. The method of transmission which comprises variably amplifying a wave and opposing said amplified wave by another wave of constant amplitude.

4. The method of transmitting energy, which comprises producing a wave, modifying said wave in accordance with speech, producing a second wave of constant amplitude, and causing said modified wave and said constant amplitude wave to oppose each other in a transmission circuit.

5. The method of transmitting energy, which comprises producing a wave, variably amplifying said wave, producing a second wave, amplifying said second wave by a constant amount, and causing said amplified waves to oppose each other.

6. The method of telephony which comprises subjecting periodic energy to speech variations and opposing the resulting varied energy by unvaried energy of similar character.

7. The method of transmission which comprises varying waves non-periodically, opposing the resulting varied waves by unvaried waves and transmitting the resultant waves.

8. The method of transmitting energy which comprises modulating a carrier wave in accordance with speech to produce a modulated carrier wave and opposing said modulated wave by an unmodulated wave to neutralize the unmodulated portion of said modulated wave.

9. The method of signaling which comprises causing a high frequency wave to traverse an impedance, varying the magnitude of said impedance in accordance with speech, causing a second wave of the same frequency to traverse an impedance of substantially constant magnitude and causing said waves to thereafter oppose each other.

10. The method of transmission comprising producing an unmodulated wave, modulating said wave in accordance with a non-periodic current to produce a modulated wave, and neutralizing the unmodulated component of said modulated wave by impressing thereon an unmodulated wave of an amplitude equal to that of said component, and of the frequency of said first unmodulated wave.

11. The method of signaling which consists in generating a high frequency continuous wave, modulating said wave in accordance with speech to produce a modulated wave, and neutralizing the unmodulated component of said modulated wave by superimposing thereon an unmodulated wave of an amplitude equal to that of said component and of the frequency of said continuous wave.

12. A transmission system comprising means for producing and variably amplifying a wave, and means for opposing said amplified wave by another wave of constant amplitude.

13. An energy transmission system comprising means for producing a wave, means for modifying said wave in accordance with speech, means for producing a second wave of constant amplitude, and means for causing said modified and said amplified waves to oppose each other.

14. An energy transmission system comprising means for producing a wave, means for variably amplifying said wave, means for producing a second wave, means for amplifying said second wave by a constant amount, and means for causing said amplified waves to oppose each other.

15. A telephone system comprising means for producing periodic energy, means for varying said energy in accordance with speech, and means for opposing the resulting varied energy by unvaried energy of similar characteristics.

16. A transmission system comprising means for producing a wave, means for varying said wave non-periodically, means for producing an unvaried wave, means for opposing the varied wave by said unvaried wave and means for transmitting the resultant wave.

17. Means for transmitting energy comprising a carrier wave source, means for modulating waves produced by said source in accordance with speech, and means for opposing said modulated waves by unmodulated waves to neutralize the unmodulated portion of said modulated waves.

18. A signaling system comprising a source of high frequency waves, two transmission circuits connected thereto, one of said circuits including an impedance the magnitude of which may be varied in accordance with speech, and the other of said circuits including a substantially constant impedance, and means for causing the currents transmitted by said circuits to oppose each other.

19. A transmission system comprising means for producing an unmodulated wave and for modulating said wave in accordance with a non-periodic current to produce a modulated wave, and means for neutralizing the unmodulated component of said modulated wave by impressing thereon an unmodulated wave of an amplitude equal to that of said component and of the frequency of said first-named unmodulated wave.

20. A signaling system comprising means for generating a high frequency continuous wave, means for modulating said wave in accordance with speech to produce a modulated wave, and means for neutralizing the unmodulated component of said modulated wave by superimposing thereon an unmodulated wave of an amplitude equal to that of said component and of the frequency of said continuous wave.

In witness whereof, I hereunto subscribe my name this 26th day of February, 1920.

CARL R. ENGLUND.